United States Patent
Moreau

(10) Patent No.: US 9,413,306 B2
(45) Date of Patent: Aug. 9, 2016

(54) METHOD OF CALIBRATING A MULTIPORT AMPLIFIER, MULTIPORT AMPLIFIER ALLOWING THE IMPLEMENTATION OF SUCH A METHOD, AND SATELLITE COMPRISING SUCH AN AMPLIFIER

(71) Applicant: THALES, Neuilly-sur-Seine (FR)

(72) Inventor: Pierre-Henry Moreau, Toulouse (FR)

(73) Assignee: THALES, Courbevoie (FR)

( * ) Notice: Subject to any disclaimer, the term of this patent is extended or adjusted under 35 U.S.C. 154(b) by 76 days.

(21) Appl. No.: 14/268,864

(22) Filed: May 2, 2014

(65) Prior Publication Data

US 2014/0354355 A1    Dec. 4, 2014

(30) Foreign Application Priority Data

May 3, 2013    (FR) ..................... 13 01031

(51) Int. Cl.
*H03F 3/68*    (2006.01)
*H03F 3/189*    (2006.01)
(Continued)

(52) U.S. Cl.
CPC .................. *H03F 3/189* (2013.01); *H03F 3/20* (2013.01); *H03F 3/211* (2013.01); *H03F 3/602* (2013.01); *H03F 3/68* (2013.01); *H03F 2200/429* (2013.01); *H03F 2200/451* (2013.01)

(58) Field of Classification Search
CPC ... H04J 2203/0037; H04J 1/00; H04W 52/00; H04W 52/52; H03F 3/68; H03F 1/32; H03F 1/34; H03F 1/3247; H03F 3/211; H03F 2201/3233; H03F 3/602; H03F 1/0288; H04H 20/67; H04B 1/0346
USPC .......... 330/2, 124 R, 126; 340/500; 370/491, 370/500, 274, 316; 379/338; 381/111; 455/92, 13.3, 526, 127.3, 130, 101
See application file for complete search history.

(56) References Cited

U.S. PATENT DOCUMENTS 6,006,111 A    12/1999 Rowland
9,014,619 B2 *    4/2015 Benjamin ......... H04B 7/18515
                                                  330/124 R
(Continued)

FOREIGN PATENT DOCUMENTS

WO    2008135753 A1    11/2008

OTHER PUBLICATIONS

Mario Caron, et al., "Estimation and Compensation of Amplifier Gain and Phase Mismatches in a Multiple Port Amplifier Subsystem", ESA Workshop on Advanced Flexible Telecom Payloads, Nov. 18-20, 2008, 7 papes, Noordwijk, NL.
(Continued)

*Primary Examiner* — Steven J Mottola
*Assistant Examiner* — Hafizur Rahman
(74) *Attorney, Agent, or Firm* — Baker & Hostetler LLP

(57) ABSTRACT

A method of calibrating a multiport amplifier comprising a plurality of input ports, a plurality of power amplifiers linked to input ports by a matrix distributing signals, a plurality of output ports linked to the power amplifiers by a matrix recombining signals and a plurality of elements for weighting the signals associated with the power amplifiers, comprises: determining a normalized mean cross-correlation between an output signal present at the output port, taken as reference, and the signals present at the other output ports; and iteratively adjusting weights of the weighting elements so as to minimize the normalized mean cross-correlation or to render it less than a predetermined threshold. A multiport amplifier comprising a calibration module configured or programmed to implement such a calibration method, and a satellite for telecommunications whose payload comprises such a multiport amplifier, are also provided.

24 Claims, 8 Drawing Sheets

(51) Int. Cl.
*H03F 3/21* (2006.01)
*H03F 3/60* (2006.01)
*H03F 3/20* (2006.01)

(56) References Cited

U.S. PATENT DOCUMENTS

2010/0156528 A1* 6/2010 Couchman ............ H03F 1/0205
330/124 R

2010/0271121 A1* 10/2010 Jones ...................... H03F 3/602
330/124 D
2012/0280748 A1 11/2012 Tronche et al.
2012/0319772 A1 12/2012 Chang

OTHER PUBLICATIONS

Zhiwen Zhu, et al., "Ka-Band Multi-Port Power Amplifier Calibration Experiment and Results", 2010 Second International Conference on Advances in Satellite and Space Communications, Jun. 13, 2010, pp. 11-14, IEEE, Piscataway, NJ, USA, XP031703522.

* cited by examiner

METHOD OF CALIBRATING A MULTIPORT AMPLIFIER, MULTIPORT AMPLIFIER ALLOWING THE IMPLEMENTATION OF SUCH A METHOD, AND SATELLITE COMPRISING SUCH AN AMPLIFIER

CROSS-REFERENCE TO RELATED APPLICATION

This application claims priority to foreign French patent application No. FR 1301031, filed on May 3, 2013, the disclosure of which is incorporated by reference in its entirety.

FIELD OF THE INVENTION

The invention pertains to a method of calibrating a multiport amplifier, making it possible to maximize the isolation between its outputs. The invention also pertains to a multiport amplifier comprising means for implementing such a method, as well as to a satellite, notably for telecommunications, whose payload comprises such an amplifier.

The invention applies mainly to the field of telecommunications, and particularly space telecommunications.

BACKGROUND

Multiport amplifiers (MPAs) are systems used mainly in the payloads of telecommunications satellites to amplify a plurality of radiofrequency or microwave signals, for example to produce broadband transponders. The operating principle of an MPA consists in using several amplifiers to amplify all the signals concurrently. All the amplifiers, or at least several of them, contribute to the amplification of all the signals; this allows flexible allocation of the power and of the band, while ensuring optimal use of the amplifiers. This operating principle, known per se, is illustrated by FIG. 1 which schematically represents a multiport amplifier exhibiting four input ports PE1-PE4, through which four radiofrequency signals s1-s4 enter, and four output ports PS1-PS4, through which the amplified signals S1-S4 exit. The input ports are linked to the inputs $i_i1$-$i_i4$ of a distributing matrix, or input matrix IBM, which exhibits one and the same number of outputs $o_i1$-$o_i4$. This matrix is configured in such a way that the signal si (for example s1, represented by a vector of vertical orientation) present at an input (in this case, $i_i1$) is divided over all its outputs with a different phase shift (indicated by the change of orientation of the vectors). Thus, for example, the signal s1 has no phase shift at the output $o_i1$, has a phase shift of 90° at the outputs $o_i2$ and $o_i3$ and has a phase shift of 180° at the output $o_i4$. The same goes, with different phase shifts, for the signals s2-s4 (not represented). This mode of operation corresponds to a "Butler" matrix, known per se.

The signals arising from the outputs $o_i1$-$o_i4$, which are therefore linear combinations of the input signals s1-s4, are amplified by identical power amplifiers PA1-PA4, which may be, for example, of the travelling wave tube (TWTA, standing for "Traveling Wave Tube Amplifier") or semi-conductor type. The amplified signals are applied to the inputs $i_o1$-$i_o4$ of a combining matrix, or output matrix OBM, which carries out an operation analogous to that of the distributing matrix; in the case of FIG. 1, OBM is also a Butler matrix.

It may be seen in FIG. 1 that, if the phase shifts introduced by the two matrices are chosen in an opportune manner, the vectors representative of the amplified signal s1 vanish on the outputs $o_o2$-$o_o4$, and are combined on the output $o_o1$ alone. Likewise, the vectors representative of the amplified signal s2 vanish on the outputs $o_o1$, $o_o3$ and $o_o4$, and are combined in a constructive manner on the output $o_o2$ alone, and so on and so forth. Thus, the amplified signal $S_i$, arising from the output port Pi, corresponds to the input signal si amplified, without any contribution from the other input signals sj with j≠i (i,j=1-4).

This manner of operation presupposes ideal input and output matrices and power amplifiers with rigorously identical properties. In reality, this is not the case: the phase shifts introduced by the matrices may be different from the nominal ones, the power of the signals at input may be unequally divided between the outputs, the amplifiers may exhibit different gains and phases, etc. Furthermore, the properties of various elements may drift over time. Because of these discrepancies with respect to an ideal situation, the isolation between the various outputs of the multiport amplifier is not perfect; this signifies that interference terms corresponding to the input signals sj with j·i will be found on each output port PSi.

FIG. 2A shows the spectra of the output signals in the case of a perfectly balanced MPA (the models of the Butler matrices are perfect); the power spectral densities are expressed in dBm and the frequencies (f) in GHz. It may be noted that each output signal Si—which is an amplified version of a corresponding input signal si—exhibits a band which is about 50 MHz in width and a central frequency (frequency of the carrier) which differs, such that the bands of the various signals do not overlap: one then speaks of "disjoint frequency plan". It may be seen that the isolation is practically perfect (interference level less than −43 dB), since the interferences between signals is invisible to the naked eye. The isolation is defined as the difference (in decibels) of the integrated powers in the band of the reference signal (in the present case, 50 MHz).

FIG. 2B shows the spectra obtained by introducing random imbalances defined by Gaussian distributions of the amplitude error and phase error with $\sigma_A$ (standard deviation of the amplitude error)=0.8 dB and $\sigma_\phi$ (standard deviation of the phase error)=3°; the models of the Butler matrices are "real" (arising from measurements). The interference between signals is clearly visible, and a calculation makes it possible to determine that the interference level is of the order of −22 dB.

The graph of FIG. 2C shows how imbalances in phase (ΔΦ, in degrees "°") and in amplitude (ΔA, in dB) affect the isolation IS (in dB) between two outputs of a multiport amplifier.

To remedy these imbalances, the amplifier of FIG. 1 comprises weighting elements EP1-EP4, each consisting of an adjustable attenuator (more rarely a preamplifier) and an adjustable phase shifter linked in cascade, associated with respective amplifiers and generally connected upstream of the latter. As only the relative attenuations and phase shifts between the outputs are relevant, one of the weighting elements may optionally be omitted.

By adjusting in an opportune manner the complex weights introduced by these weighting elements it is possible to restore almost ideal isolation—and in any event of greater than 20 dB or more—between the outputs. The calibration operation consisting in adjusting these complex weights can be carried out manually by a technician or, preferably, automatically.

Document WO 2008/135753 describes an automatic method of calibrating a multiport amplifier aimed at maximizing the isolation between the outputs, using a measurement signal or test signal injected into an input. The main drawback of this method is that the injected signal is amplified and, in a telecommunications system, impairs the signal-to-interference ratio C/I.

The article by Mario Caron and Xinping Huang "Estimation and compensation of amplifier gain and phase mismatches in a multiple port amplifier subsystem", ESA Workshop on Advanced Flexible Telecom Payloads, Nov. 18-20 2008, Noordwijk (Netherlands), discloses an automatic method of calibrating a multiport amplifier not requiring the injection of a measurement signal. This method is based on the study of the probability density functions of the output signals so as to identify, and minimize, the interference between outputs. This is possible only if the type of modulation used is known precisely, thereby limiting the flexibility of the solution.

SUMMARY OF THE INVENTION

The invention is aimed at affording an automatic method of calibrating a multiport amplifier aimed at maximizing the isolation between the outputs not exhibiting, or exhibiting in an attenuated form, the drawbacks of the prior art. More particularly, the invention is aimed at avoiding the injection of a measurement signal or calibration signal that would be superimposed on the traffic signals, and at not introducing any constraint relating to the type of modulation employed.

An object of the invention making it possible to achieve this aim is a method of calibrating a multiport amplifier comprising a plurality of input ports, a plurality of power amplifiers linked to said input ports by way of a matrix for distributing signals and a plurality of output ports linked to said power amplifiers by way of a matrix for recombining signals, said matrices for distributing and recombining signals being adapted for dividing a signal present at a said input port between a plurality of said power amplifiers and for recombining said signal, amplified, at the level of a said output port, an element for weighting the signals being associated with each said power amplifier; the method being characterized in that it comprises the steps consisting in:
  a) determining a normalized mean cross-correlation between an output signal present at a said output port, taken as reference, and the signals present at the other said output ports; and
  b) iteratively adjusting weights of said weighting elements so as to minimize said normalized mean cross-correlation or to render it less than a predetermined threshold.

According to particular embodiments of such a method:
Said normalized mean cross-correlation can be normalized with respect to a mean auto-correlation of the signal present at said output port taken as reference.
The output port taken as reference can be the one which exhibits the signal having the highest power level.
Said weights can be complex weights, each comprising a modulus and a phase, said step b) comprising the substeps consisting in:
b1) iteratively adjusting the phases of said weights; and
b2) iteratively adjusting the moduli of said weights.
More particularly, said sub-steps b1) and b2) can be implemented successively, in an arbitrary order, said sub-step b1) can comprise the successive adjusting of the phases of the weights of the weighting elements associated with the various power amplifiers, and said sub-step b2) can comprise the successive adjusting of the moduli of the weights of the weighting elements associated with the various power amplifiers.
Said step b) can comprise the following operations:
  i. determining said normalized mean cross-correlation;
  ii. applying a predefined increment to the modulus and/or to the phase of a said weight to be adjusted;
  iii. re-determining said normalized mean cross-correlation and, if its value has increased, changing the sign of said increment; and
  iv. applying said predefined increment to the phase and/or to the modulus of said weight to be adjusted, with the sign determined during operation iii;
  v. re-determining said normalized mean cross-correlation and, if its value has decreased while remaining greater than a predefined threshold, repeating operations iv. and v.

Said normalized mean correlations can be determined inside a frequency band substantially coincident with that of the signal present on said reference port.
The signals present on said output ports can exhibit a disjoint frequency plan.
Preferably, no measurement signal is injected into said amplifier in order to carry out the calibration.

Another object of the invention is a multiport amplifier comprising a plurality of input ports, a plurality of power amplifiers linked to said input ports by way of a matrix for distributing signals and a plurality of output ports linked to said power amplifiers by way of a matrix for recombining signals, said matrices for distributing and recombining signals being adapted for dividing a signal present at a said input port between a plurality of said power amplifiers and for recombining said signal, amplified, at the level of a said output port, an element for weighting the signals being associated with each said power amplifier; characterized in that it also comprises a calibration module configured or programmed to implement a calibration method such as set forth hereinabove.

According to particular embodiments of such a multiport amplifier:
Said calibration module can comprise: a first and a second selector for selecting a first and a second output port; a first and a second acquisition chain for acquiring the signals present on said first and second output ports, for selecting, converting to an intermediate frequency, filtering and digitizing said signals; and a processor programmed or configured to: drive said first and second selectors and said first and second acquisition chains; acquire the digitized signals arising from said acquisition chains; on the basis of the digitized signals acquired, calculate a normalized mean cross-correlation between an output signal acquired from an output port, taken as reference, and the signals acquired from the other output ports; iteratively adjust the weights of said weighting elements so as to minimize said normalized mean cross-correlation or to render it less than a predetermined threshold.
Said processor can be remotely sited in whole or in part.
Each said weighting element can comprise a variable attenuator and a variable phase shifter connected in cascade.
The amplifier can, preferably, operate in at least one band chosen from among the Ku band, the K band and the Ka band. In fact, the invention is all the more useful the higher the frequency of the carriers, as well as when the power amplifiers are travelling wave tubes. Thus, the Ka band constitutes a favored field of application of the invention.
Yet another object of the invention is a satellite for telecommunications whose payload comprises a multiport amplifier such as set forth hereinabove.

BRIEF DESCRIPTION OF THE DRAWINGS

Other characteristics, details and advantages of the invention will emerge on reading the description offered with reference to the appended drawings given by way of example and which represent, respectively.

DETAILED DESCRIPTION

Figure 1:
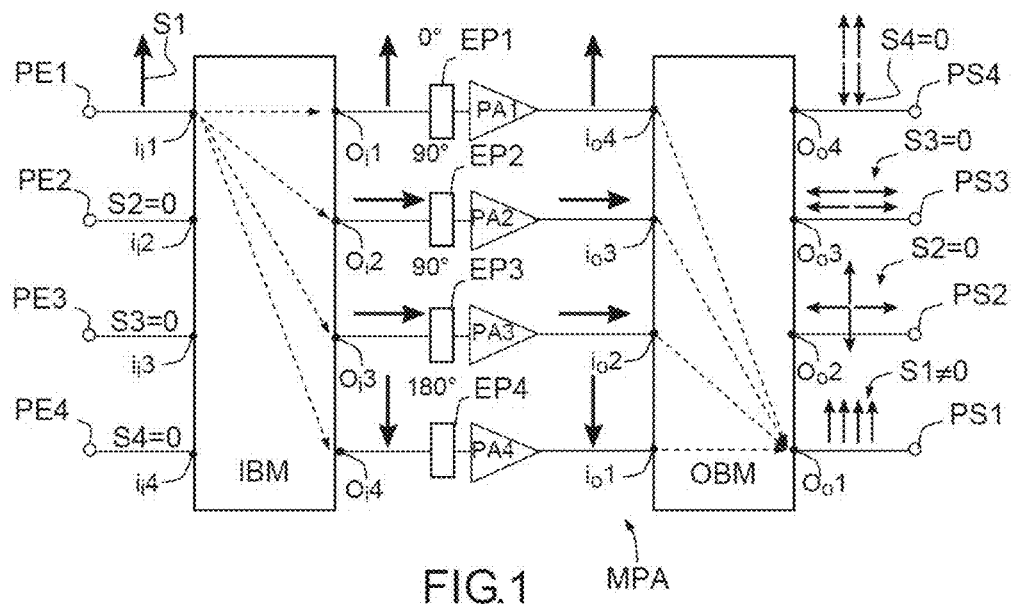
FIG. 1, a schematic of a multiport amplifier exhibiting four input ports, four radiofrequency signals, and four output ports.
Figure 2A:
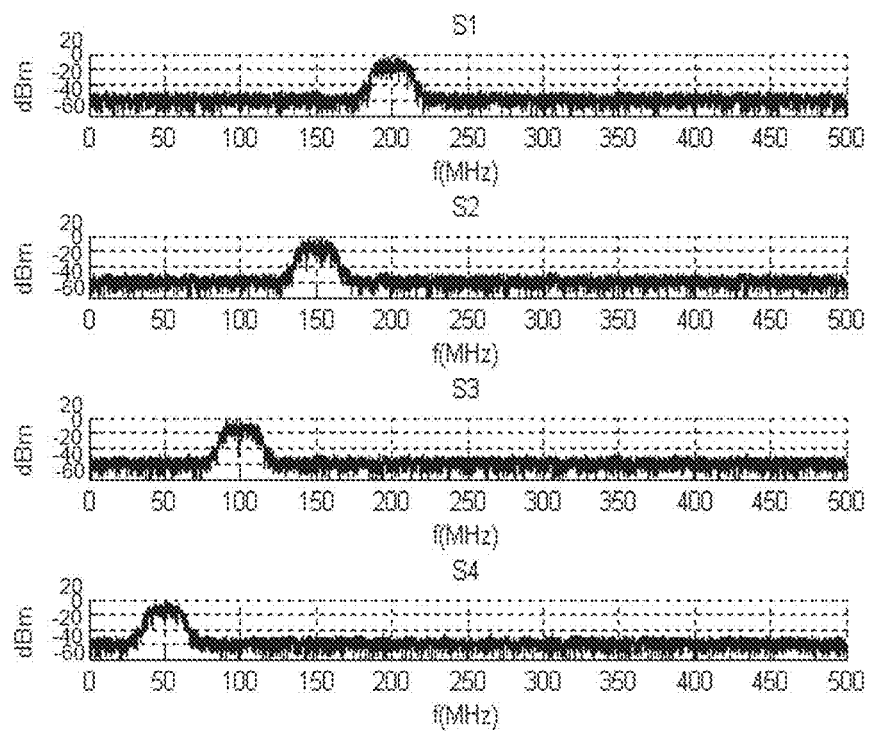
FIG. 2A, a spectra of the four output signals in the case of a perfectly balanced multiport amplifier.
Figure 2B:
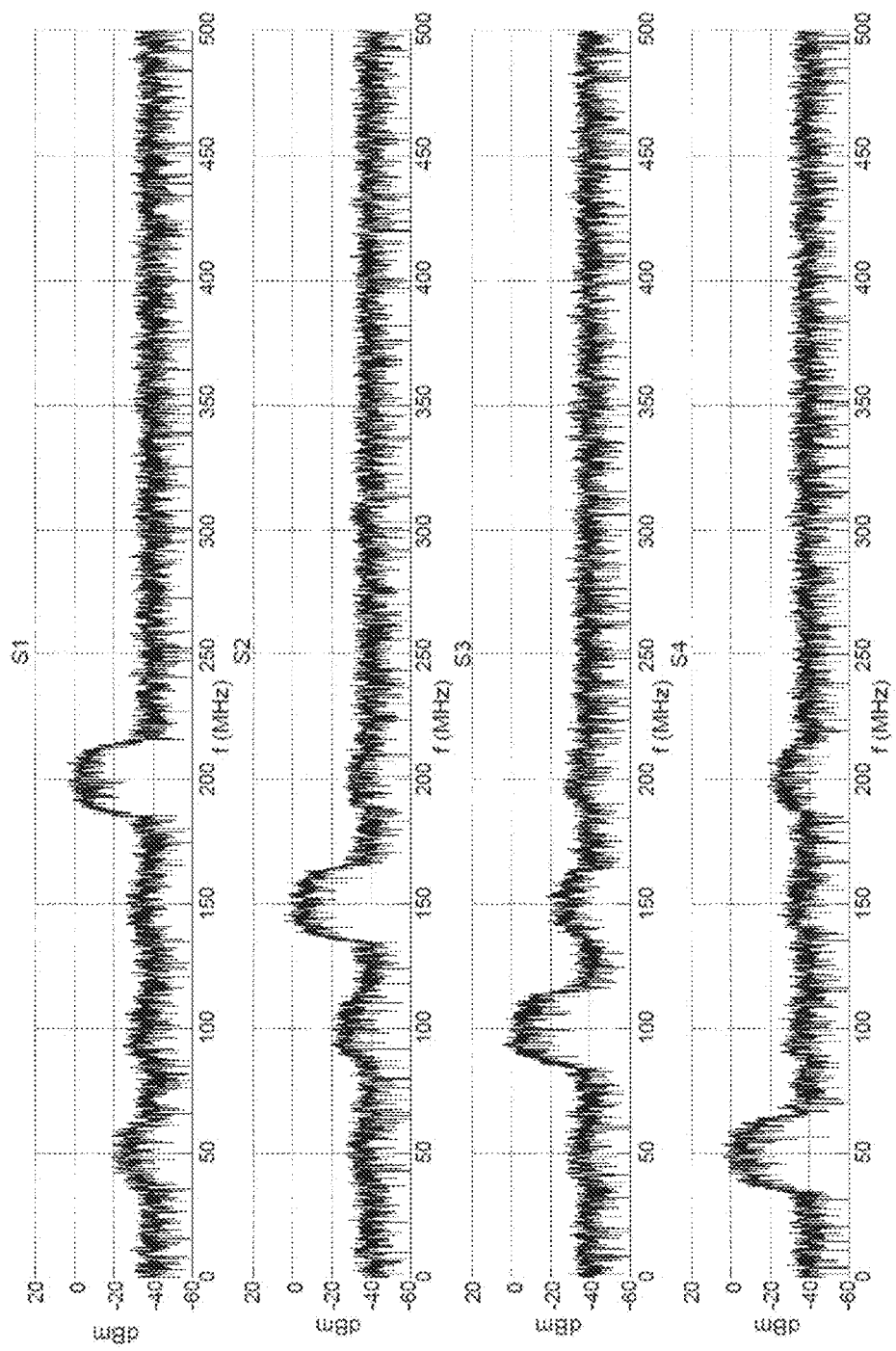
FIG. 2B, a spectra of the four output signals in the case of introducing random imbalances defined by Gaussian distributions of an amplitude error and a phase error.
Figure 2C:
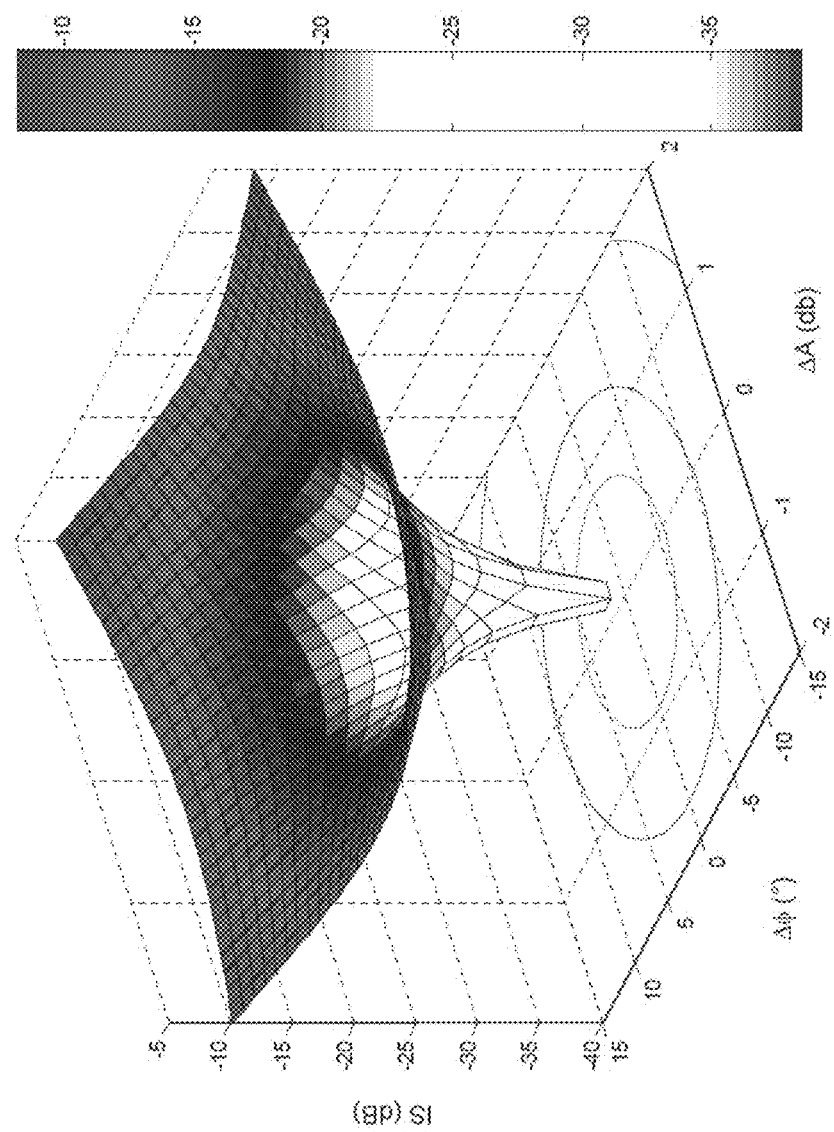
FIG. 2C, a graph showing how imbalances in phase and in amplitude affect the isolation between two outputs of a multiport amplifier.
Figure 3:
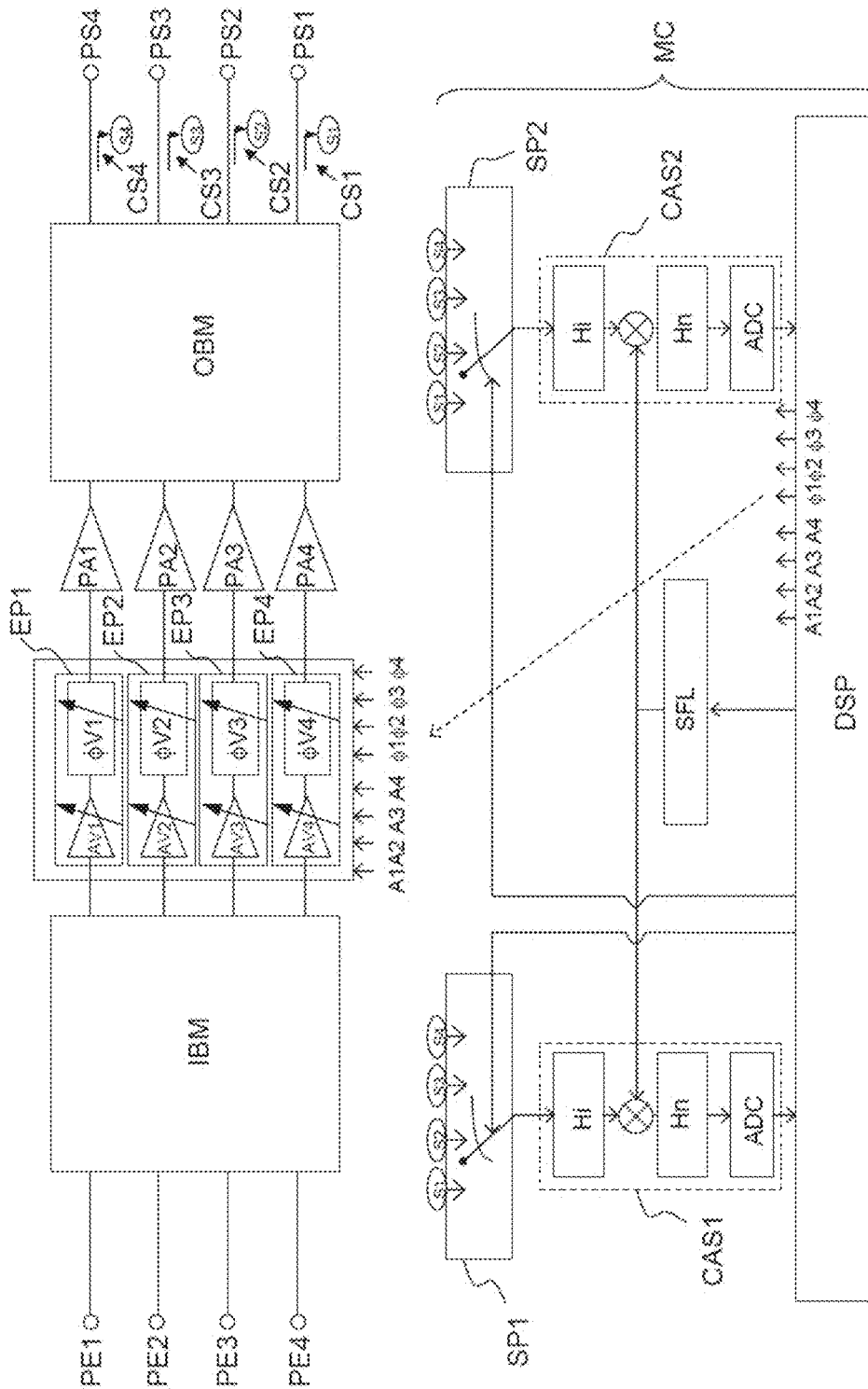
FIG. 3, a basic diagram of a multiport amplifier according to an embodiment of the invention.

As illustrated in FIG. 3, an MPA according to an embodiment of the invention is differentiated from that of FIG. 1 in that it comprises a calibration module MC which receives as input a fraction of the signals S1-S4 present on the output ports—tapped off by signal couplers CS1 to CS4—and generates signals for driving the weighting elements EP1-EP4. More precisely, in the embodiment considered here, each weighting element comprises a variable attenuator AVi which receives a drive signal Ai and a variable phase shifter ΦVi which receives a drive signal Φi (i=1-4).

Two selectors SP1, SP2 each independently select an output port (more precisely: each select a signal tapped off by a signal coupler on an output port). The selected signals are processed by respective acquisition chains, CAS1, CAS2 which comprise, conventionally, an image filter Hi, a mixer for converting the signals to an intermediate frequency, a Nyquist filter Hn and an analog-digital converter ADC. The digital signals thus obtained are processed by a processor DSP to generate the drive signals A1-A4, Φ1-Φ4. The processor DSP also drives the selectors SP1, SP2 and the local frequency synthesizer SFL, used for the frequency conversion.

The processor DSP is preferably a digital processor—and notably a processor for digital signal processing—programmed in an opportune manner, but other possibilities (for example, the production of a dedicated digital circuit) are conceivable.

According to a particular embodiment of the invention, the calibration of the multiport amplifier is carried out in the following manner.

Firstly, the processor DSP identifies the output port corresponding to the signal exhibiting the highest power. This selection is performed by scanning the outputs by means of one of the selectors and by integrating the power of the signals acquired in the Nyquist band (or in a narrower band, selected by a, preferably digital, filter). This makes it necessary to know the frequency plan so as to set the local frequency synthesizer SFL to the central frequency of each output. The output port thus identified—hereinafter, PS1—is taken as reference.

Thereafter the first selector SP1 is driven so as to select, over a predefined time window said reference port, while the second selector SP2 is driven so as to select, over one and the same time window, another output port. This operation is repeated for all the output ports. Three pairs of acquired and digitized signals $(S1_{(2)}, S2)$; $(S1_{(3)}, S3)$, $(S1_{(4)}, S4)$ are thus obtained, where $S1_{(i)}$ identifies the signal S1 acquired simultaneously with Si with i=2-4. This allows the calculation, by the processor DSP, of the intercorrelations, or cross-correlations, between the signals $S1_{(i)}$ and Si with i=2-4, whose maxima are indicated by $R_{1i}$: $R_{12}$, $R_{13}$ and $R_{14}$. The powers of the signals $S1_{(i)}$, indicated by $P_{1(Ta1i)}$, are also calculated; thus $P_{1(Ta_{12})}$ is the power of the signal $S1_{(2)}$ tapped off by the port PS1 during the synchronous acquisition of the signals S1 and S2; $P_{1(Ta_{13})}$ is the power of the signal $S1_{(2)}$ tapped off by the port PS1 during the synchronous acquisition of the signals S1 and S3 and $P_{1(Ta_{14})}$ is the power of the signal $S1_{(2)}$ tapped off by the port PS1 during the synchronous acquisition of the signals S1 and S4.

This allows the calculation of a normalized mean cross-correlation:

$$C_{(0)} = \frac{R_{12}}{P_{1(Ta_{12})}} + \frac{R_{13}}{P_{1(Ta_{13})}} + \frac{R_{14}}{P_{1(Ta_{14})}}$$

The generalization to the case of N ports, with N an integer greater than 1—and generally even—is immediate.

The index (0) signifies that this appertains to the normalized mean cross-correlation determined before the first iteration of the process for adjusting the weighting coefficients, as will be explained further on.

Preferably, the cross-correlations are calculated taking into consideration only the band of the signal present on the reference port. Thus, the processor DSP drives the local frequency synthesizer SFL in such a way as to select the carrier of the signal s1; the filtering of this signal is ensured by the sampling; however, if its band is narrower than the Nyquist band, an extra filtering—preferably digital, by the processor DSP—can be envisaged.

A principle underlying the invention consists in iteratively adjusting the complex weights of the weighting elements EP1-EP4 so as to minimize the normalized mean cross-correlation, or at the very least to ensure that it is less than a predefined threshold. Indeed, the higher the normalized mean cross-correlation, the less the outputs of the multiport amplifier are isolated from one another.

Several optimization algorithms can be used to carry out this iterative adjustment.

One of them will be described hereinafter with the aid of FIG. 4. The principle of this algorithm consists in incrementing the phase of the weight of a weighting element by a predefined interval (positive or negative), in determining whether this leads to a decrease in the normalized mean cross-correlation and: in the affirmative, in re-applying the increment; in the converse case, changing its sign before re-applying it. After having adjusted the phases of all the weighting elements in this manner, we proceed in the same fashion for the amplitudes. Thereafter, it is possible to repeat the process. As a variant it is possible to adjust the amplitudes first, or to adjust the amplitude and the phase of one element before passing to the next.

Figure 4:
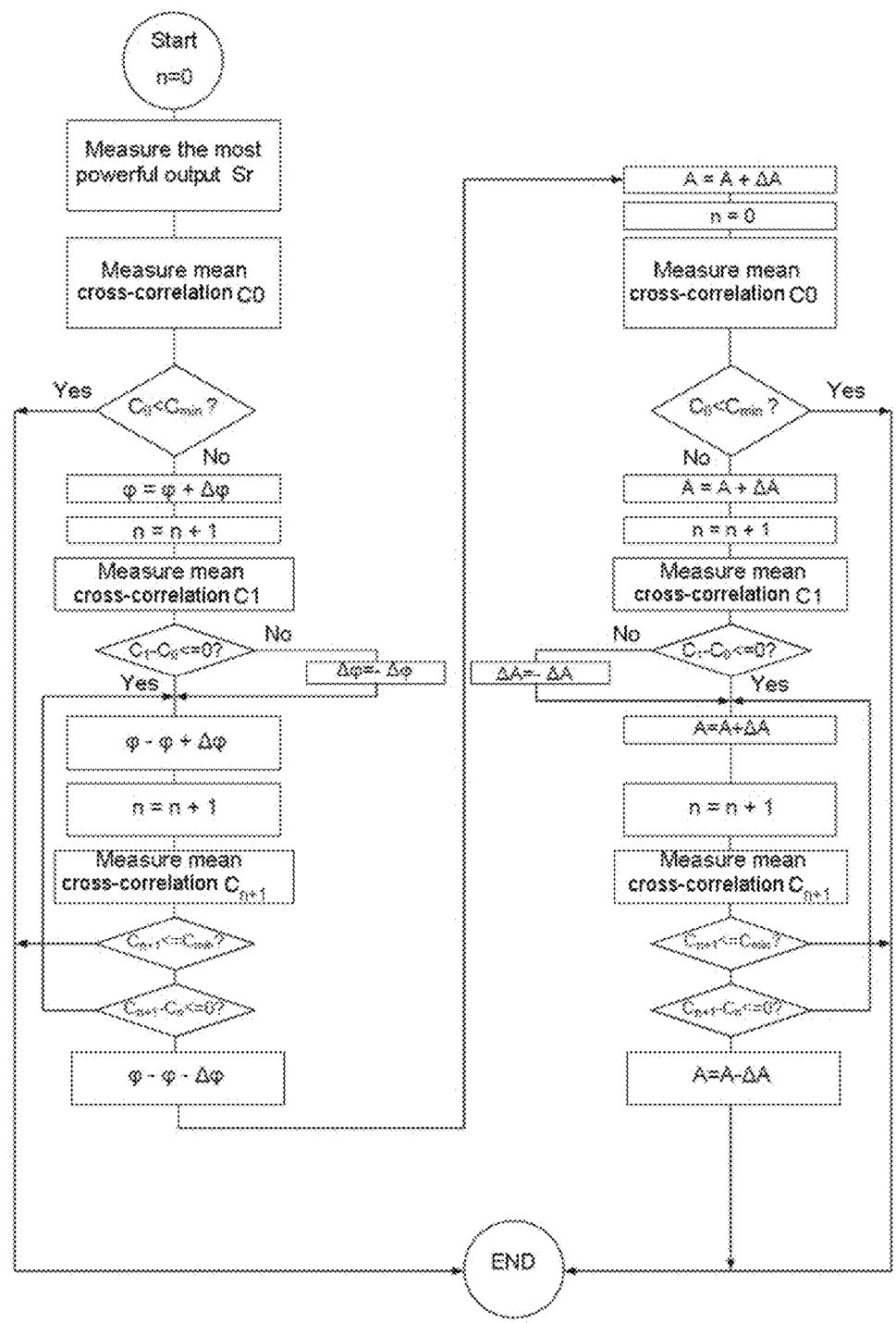
FIG. 4, a flowchart of the procedure for adjusting the complex weights of the weighting elements making it possible to maximize the isolation between the outputs of the amplifier of FIG. 3.

As shown by FIG. 4, the first operations of the algorithm are: the determination of the most powerful output Sr, the measurement of its power and the measurement of the mean (normalized) cross-correlation $C_{(0)}$—or more specifically its calculation on the basis of the acquired signals. Thereafter it is verified whether this mean normalized cross-correlation is greater than a predetermined threshold $C_{min}$, since in the converse case it may be considered that the isolation is already sufficient and that no calibration is necessary.

Thereafter the phase φ of the complex weight of a first weighting element is incremented by an interval Δφ of predefined value, and the mean (normalized) cross-correlation, $C_{(1)}$, is recalculated. It is then determined if the newly calculated cross-correlation $C_{(1)}$ is larger or smaller than $C_{(0)}$, if it is larger, this signifies that the phase increment has increased the imbalances instead of reducing them; the sign of the interval of the increment is therefore changed: Δφ→−Δφ; otherwise, this interval is left unchanged. Thereafter, successive increments are effected—always of one and the same interval, the sign of which has been determined once and for all after the first iteration just described—until one of the following conditions is satisfied:

either the mean cross-correlation drops below the threshold $C_{min}$, in which case it is considered that the isolation is sufficient and the process stops;

or the mean cross-correlation begins to increase ($C_{(n+1)} > C_{(n)}$), thereby signifying that the optimal setting point has been exceeded; in this case, Δφ is subtracted from the phase of the complex weight so as to return to the best identified setting, and the next successive weighting element is adjusted (for the sake of simplicity, the flowchart of FIG. 1 is limited to the case of a single weighting element).

When all the phases have been adjusted, and if the mean cross-correlation is not less than the threshold $C_{min}$, the amplitudes are adjusted according to the same scheme (right-hand part of the flowchart).

Next, if the isolation is still not satisfactory, we repeat again (not represented).

Of course, it is possible to impose a maximum number of iterations not to be exceeded, whether in respect of the adjustment of the phase and/or of the amplitude of each element or in respect of the procedure as a whole.

Figure 5A:
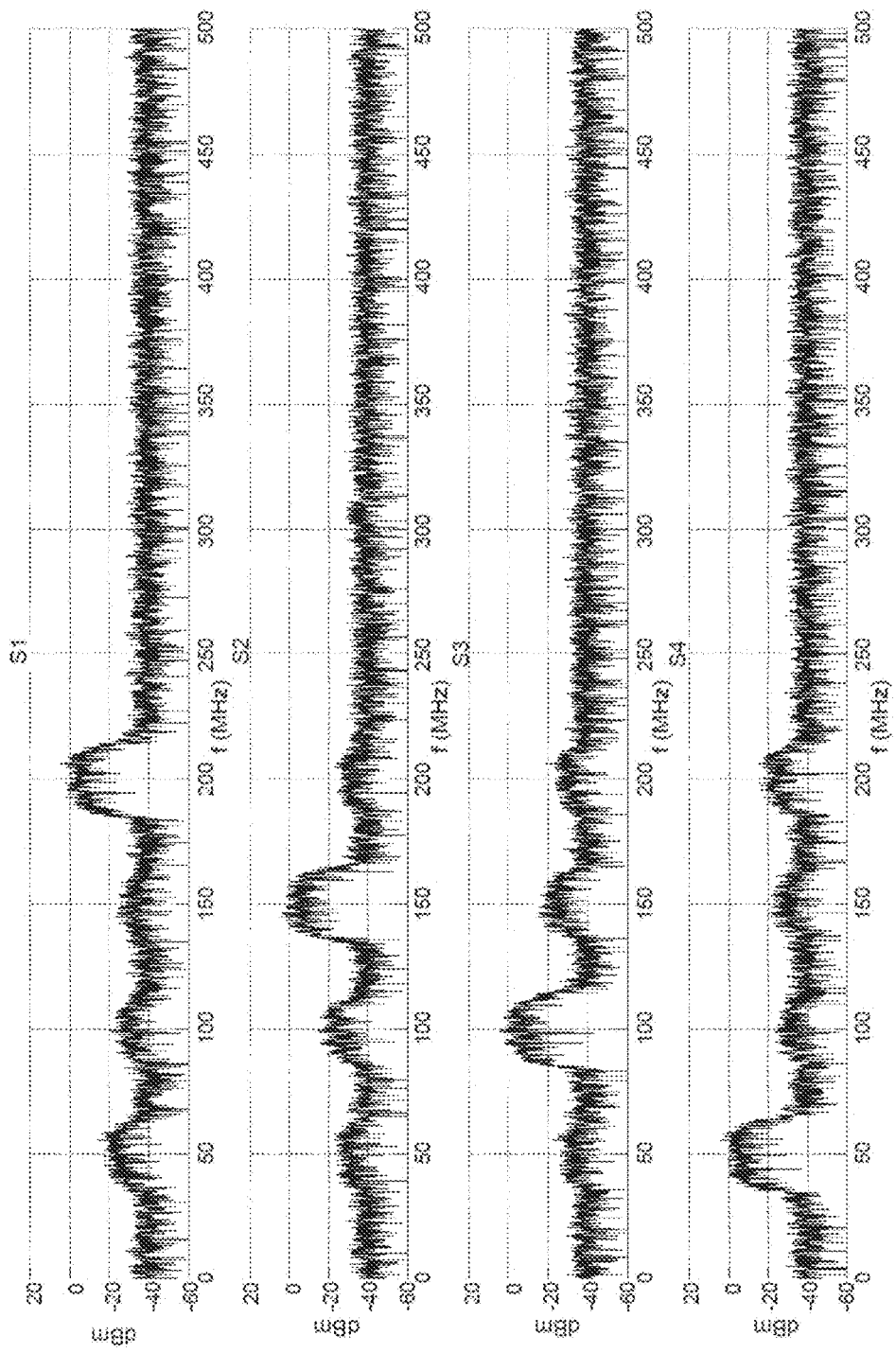
FIGS. 5A and 5B spectra of the outputs of the amplifier of FIG. 3 illustrating the technical result of the invention.
Figure 5B:
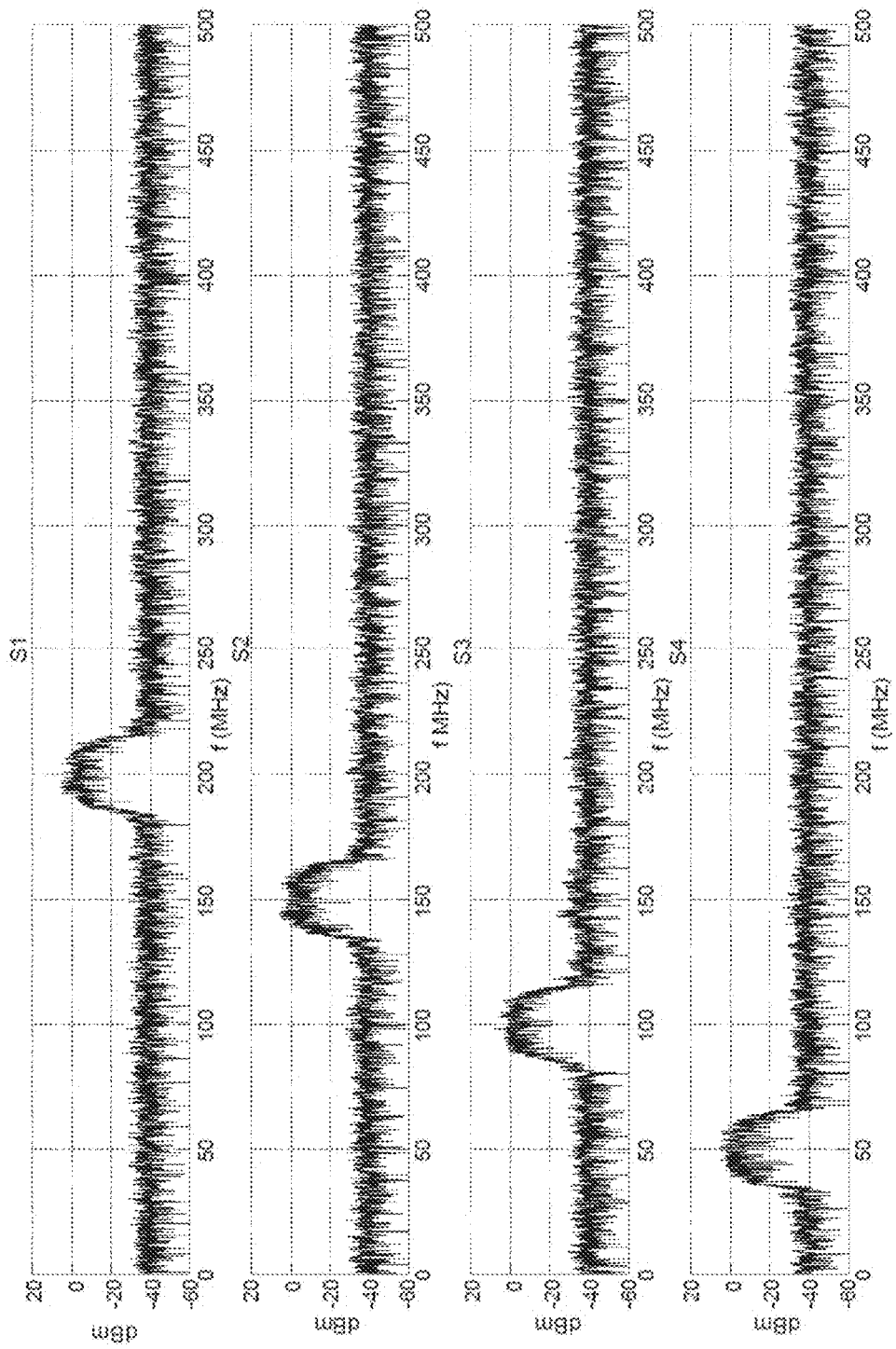

FIGS. 5A-5C make it possible to illustrate the technical result of the invention. They show the spectra of the output signals of the multiport amplifier of FIG. 3, obtained by numerical simulations under the following conditions:

The imbalances of the amplitudes and of the phases follow Gaussian distributions with σA=0.8 dB and σφ=3°;

Dynamic swing in terms of power of the carriers=3 dB;

Acquisition of the signals on $2^{13}$ points;

Limitation of the band to 50 MHz (sampling at 100 MHz);

A QPSK-modulated carrier with bandwidth of 20 MHz on each input;

Carriers equidivided between 50 MHz and 200 MHz;

Models of the Butler Matrices arising from measurements on real devices.

No modeling of the AM/AM effects (variations of the gain with the operating point in terms of power) and AM/PM effects (variation of the phase of the transfer function with the operating point in terms of power) of the power amplifiers.

FIG. 5A shows the spectra before compensation; it may be seen that the interference is significant, and indeed the isolation in the worst case equals −16.8 dB, this being generally unsatisfactory. After 5 iterations (FIG. 5B) the interference between carriers has practically disappeared and the isolation in the worst case equals −31.9 dB. In fact, already a single iteration makes it possible to bring the minimum isolation to a value of −22.6 dB, which is generally considered sufficient for most applications.

Figure 6:
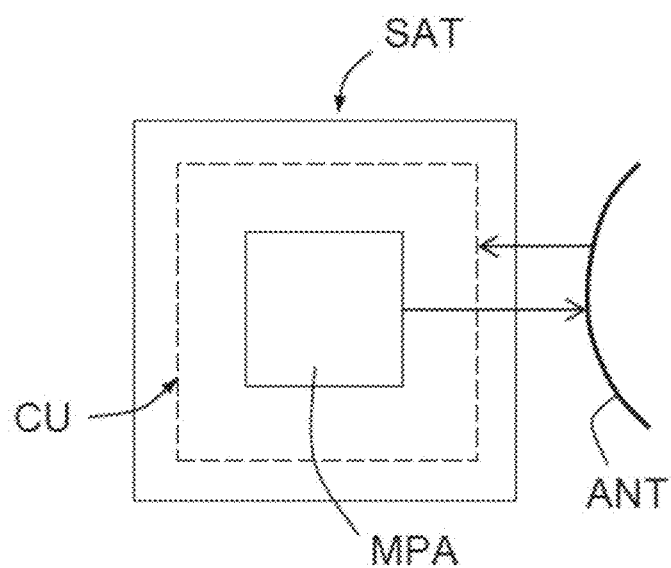
FIG. 6, schematically, the integration of a multiport amplifier according to an embodiment of the invention in a telecommunications satellite.

FIG. 6 very schematically illustrates the integration of a multiport amplifier MPA according to the invention with the payload CU of a telecommunications satellite SAT. The payload CU is a transponder comprising a transmitter and a receiver sharing one and the same antenna ANT; the multiport amplifier constitutes the power stage of the transmitter.

The invention has been described with reference to a particular embodiment, but a large number of variants is conceivable:

the multiport amplifier can be used in applications other than space telecommunications, and operate in a different spectral band from those considered here (Ku-K-Ka bands), for example the L, S, C and X bands;

the input and output matrices may not be Butler matrices; in particular if it is desired to use a number of ports, and therefore of power amplifiers, which is not a power of two;

the number of amplifiers may be different to, and in particular greater than, the number of signals to be amplified;

exceptionally, the calibration can be performed by acting solely on the phase, or solely on the modulus, of the weights of the weighting elements;

the calibration method may be implemented by using the traffic signals which are processed by the multiport amplifier during its normal operation; as a variant, in the absence of traffic, it will be possible to use carriers modulated by a test signal (or indeed unmodulated) or simply noisy carriers;

the signals processed by the multiport amplifier may not exhibit a disjoint frequency plan but, for example, use one and the same carrier; however, in this case, the isolation between the outputs may turn out to be worse than in the case of a disjoint frequency plan;

the reference output port may not be the one which exhibits the most powerful signal, although this embodiment is preferred;

several different optimization algorithms may be used to adjust the weights of the weighting elements;

the processing of the signals may be remotely sited at least in part; for example, the signals acquired and digitized by the acquisition chains may be stored in a memory and transmitted to a ground station which performs the calculations and returns control signals carrying out the adjustments of the weighting elements.

The invention claimed is:

1. A method of calibrating a multiport amplifier comprising a plurality of input ports, a plurality of power amplifiers linked to the plurality of input ports by way of a matrix for distributing signals, and a plurality of output ports linked to the plurality of power amplifiers by way of a matrix for recombining signals, the matrices for distributing and recombining signals being adapted for dividing a signal present at an input port between a plurality of the power amplifiers and for recombining the signal, amplified, at a level of an output port, an element for weighting the signals being associated with each power amplifier;

wherein the method comprises:

a) determining a normalized mean cross-correlation between an output signal present at the output port, taken as reference, and signals present at the other output ports; and b) iteratively adjusting weights of the weighting elements to minimize the normalized mean cross-correlation or to render it less than a predetermined threshold;

wherein the weights are complex weights, each weight comprising a modulus and a phase, wherein step b) further comprises:

b1) iteratively adjusting the phases of the weights; and
b2) iteratively adjusting the moduli of the weights; and
wherein the steps b1) and b2) are implemented successively, in an arbitrary order, and wherein step b1) further comprises successive adjusting of the phases of the weights of the weighting elements associated with the power amplifiers; and wherein step b2) further comprises successive adjusting of the moduli of the weights of the weighting elements associated with the power amplifiers.

2. The method according to claim 1, wherein the normalized mean cross-correlation is normalized with respect to a mean auto-correlation of the signal present at the output port taken as reference.

3. The method according to claim 1, wherein the output port taken as reference is that which exhibits a signal having a highest power level.

4. The method according to claim 1, wherein the signals present on said output ports exhibit a disjoint frequency plan.

5. The method according to claim 1, wherein no measurement signal is injected into said amplifier in order to carry out the calibration.

6. A method of calibrating a multiport amplifier comprising a plurality of input ports, a plurality of power amplifiers linked to the plurality of input ports by way of a matrix for distributing signals, and a plurality of output ports linked to the plurality of power amplifiers by way of a matrix for recombining signals, the matrices for distributing and recombining signals being adapted for dividing a signal present at an input port between a plurality of the power amplifiers and for recombining the signal, amplified, at a level of an output port, an element for weighting the signals being associated with each power amplifier;
wherein the method comprises:
a) determining a normalized mean cross-correlation between an output signal present at an output port, taken as reference, and signals present at the other output ports; and
b) iteratively adjusting weights of the weighting elements to minimize the normalized mean cross-correlation or to render it less than a predetermined threshold;
wherein the weights are complex weights, each weight comprising a modulus and a phase, wherein step b) further comprises:
b1) iteratively adjusting the phases of said weights;
b2) iteratively adjusting the moduli of said weights;
b3) determining said normalized mean cross-correlation;
b4) applying a predefined increment to a modulus and/or to a phase of a said weight to be adjusted;
b5) re-determining said normalized mean cross-correlation and, if its value has increased, changing the sign of said increment;
b6) applying said predefined increment to said phase and/or to said modulus of said weight to be adjusted, with the sign determined during operation b5); and
b7) re-determining said normalized mean cross-correlation and, if its value has decreased while remaining greater than a predefined threshold, repeating operations b6) and b7); and
wherein steps b1) and b2) are implemented successively, in an arbitrary order, and wherein step b1) further comprises successive adjusting of the phases of the weighting elements associated with the power amplifiers; and wherein step b2) further comprises successive adjusting of the moduli of the weights of the weighting elements associated with the power amplifiers.

7. The method of claim 6, wherein the normalized mean cross-correlation is normalized with respect to a mean auto-correlation of the signal present at the output port taken as reference.

8. The method of claim 6, wherein the output port taken as reference is that which exhibits the signal having the highest power level.

9. The method of claim 6, wherein the signals present on said output ports exhibit a disjoint frequency plan.

10. The method of claim 6, wherein no measurement signal is injected into said amplifier in order to carry out the calibration.

11. A method of calibrating a multiport amplifier comprising a plurality of input ports, a plurality of power amplifiers linked to the plurality of input ports by way of a matrix for distributing signals, and a plurality of output ports linked to the plurality of power amplifiers by way of a matrix for recombining signals, the matrices for distributing and recombining signals being adapted for dividing a signal present at an input port between a plurality of the power amplifiers and for recombining the signal, amplified, at a level of an output port, an element for weighting the signals being associated with each power amplifier;
wherein the method comprises:
a) determining a normalized mean cross-correlation between an output signal present at an output port, taken as reference, and signals present at the other output ports; and
b) iteratively adjusting weights of said weighting elements to minimize the normalized mean cross-correlation or to render it less than a predetermined threshold;
wherein the weights are complex weights, each weight comprising a modulus and a phase, wherein step b) further comprises:
b1) iteratively adjusting the phases of the weights; and
b2) iteratively adjusting the moduli of the weights; and
wherein steps b1) and b2) are implemented successively, in an arbitrary order, and wherein step b1) further comprises successive adjusting of the phases of the weights of the weighting elements associated with the power amplifiers; wherein step b2) further comprises successive adjusting of the moduli of the weights of the weighting elements associated with the power amplifiers; and
wherein the normalized mean correlations are determined inside a frequency band substantially coincident with that of the signal present on the reference port.

12. The method of claim 11, wherein said normalized mean cross-correlation is normalized with respect to a mean auto-correlation of the signal present at said output port taken as reference.

13. The method of claim 11, wherein the output port taken as reference is that which exhibits the signal having the highest power level.

14. The method of claim 11, wherein the signals present on said output ports exhibit a disjoint frequency plan.

15. The method of claim 11, wherein no measurement signal is injected into said amplifier in order to carry out the calibration.

16. A multiport amplifier comprising a plurality of input ports, a plurality of power amplifiers linked to the plurality of input ports by way of a matrix for distributing signals, and a plurality of output ports linked to the plurality of power amplifiers by way of a matrix for recombining signals, the matrices for distributing and recombining signals being adapted for dividing a signal present at an input port between a plurality of the power amplifiers and for recombining the signal, amplified, at a level of an output port, an element for weighting the signals being associated with each power amplifier; and further comprising a calibration module comprising:

- a first and a second selector for selecting a first and a second output port;
- a first and a second acquisition chain for acquiring the signals present on said first and second output ports, for selecting, converting to an intermediate frequency, filtering and digitizing said signals; and
- a processor programmed or configured to:
   drive said first and second selectors and said first and second acquisition chains;
   acquire the digitized signals arising from said acquisition chains;
   a) on the basis of the digitized signals acquired, calculate a normalized mean cross-correlation between an output signal acquired from an output port, taken as reference, and the signals acquired from the other output ports;
   b) iteratively adjust the weights of said weighting elements so as to minimize said normalized mean cross-correlation or to render it less than a predetermined threshold
   wherein the weights are complex weights, each comprising a modulus and a phase, wherein step b) further comprises:
   b1) iteratively adjusting the phases of the weights; and
   b2) iteratively adjusting the moduli of the weights; and
   wherein the steps b1) and b2) are implemented successively, in an arbitrary order, and wherein step b1) further comprises successive adjusting of the phases of the weights of the weighting elements associated with the power amplifiers; and wherein step b2) further comprises successive adjusting of the moduli of the weights of the weighting elements associated with the power amplifiers.

17. The multiport amplifier according to claim 16, wherein the processor is remotely sited in whole or in part.

18. The multiport amplifier according to claim 16, wherein each weighting element comprises a variable attenuator and a variable phase shifter connected in cascade.

19. The multiport amplifier according to claim 16, operating in at least one band chosen from among a Ku band, a K band, and a Ka band.

20. A satellite for telecommunications whose payload comprises a multiport amplifier according to claim 16.

21. The method of claim 16, wherein said normalized mean cross-correlation is normalized with respect to a mean autocorrelation of the signal present at said output port taken as reference.

22. The method of claim 16, wherein the output port taken as reference is that which exhibits the signal having the highest power level.

23. The method of claim 16, wherein the signals present on said output ports exhibit a disjoint frequency plan.

24. The method of claim 16, wherein no measurement signal is injected into said amplifier in order to carry out the calibration.

* * * * *